(12) United States Patent
Jeong

(10) Patent No.: US 8,970,282 B2
(45) Date of Patent: Mar. 3, 2015

(54) HIGH FREQUENCY SWITCH

(71) Applicant: Samsung Electro-Mechanics Co., Ltd., Suwon, Gyunggi-do (KR)

(72) Inventor: Chan Yong Jeong, Gyunggi-do (KR)

(73) Assignee: Samsung Electro-Mechanics Co., Ltd., Suwon Gyunggi-Do (KR)

( * ) Notice: Subject to any disclaimer, the term of this patent is extended or adjusted under 35 U.S.C. 154(b) by 0 days.

(21) Appl. No.: 13/766,368

(22) Filed: Feb. 13, 2013

(65) Prior Publication Data

US 2014/0145776 A1 May 29, 2014

(30) Foreign Application Priority Data

Nov. 23, 2012 (KR) .................. 10-2012-0133703

(51) Int. Cl.
*H03K 5/08* (2006.01)
*H03L 5/00* (2006.01)
*H03K 17/00* (2006.01)

(52) U.S. Cl.
CPC ....................................... *H03K 17/00* (2013.01)
USPC ........... 327/313; 327/310; 327/308; 455/333; 455/78; 333/103

(58) Field of Classification Search
CPC ............... H01P 1/10; H01P 1/15; H04B 1/44; H04W 88/02; H02M 3/156; H03F 1/0261; H03F 1/0277; H03F 3/195; H03F 3/211; H03F 3/68; H03F 2200/111; H03F 2200/429; H03H 11/245; H03L 5/00
USPC .......... 327/308–315; 455/80, 84–88, 333, 73, 455/75, 77, 78; 333/101–103, 81 R
See application file for complete search history.

(56) References Cited

U.S. PATENT DOCUMENTS

| 2005/0017786 | A1 | 1/2005 | Nakatsuka et al. |
| 2011/0140764 | A1 | 6/2011 | Shin et al. |
| 2012/0075023 | A1* | 3/2012 | Guo ............................... 330/296 |
| 2012/0229102 | A1* | 9/2012 | Burns et al. ................... 323/224 |
| 2013/0072134 | A1* | 3/2013 | Goto et al. ....................... 455/78 |

FOREIGN PATENT DOCUMENTS

| KR | 10-2004-0107425 A | 6/2006 |
| KR | 10-2006-0094005 A | 8/2006 |
| KR | 10-2011-0068584 A | 6/2011 |
| KR | 10-2012-0067275 A | 6/2012 |
| KR | 10-2012-0069529 A | 6/2012 |
| WO | 2010/098255 A1 | 9/2010 |

OTHER PUBLICATIONS

Notice of Office Action dated Dec. 11, 2014 issued in corresponding Korean Patent Application No. 10-2012-0133703 (English translation).

* cited by examiner

*Primary Examiner* — Lincoln Donovan
*Assistant Examiner* — Thomas Skibinski
(74) *Attorney, Agent, or Firm* — McDermott Will and Emery LLP

(57) ABSTRACT

There is provided a high frequency switch including: a first signal transferring unit including a plurality of first switching devices; a second signal transferring unit including a plurality of second switching devices; a first shunting unit including a plurality of third switching devices; and a second shunting unit including a plurality of fourth switching devices.

16 Claims, 9 Drawing Sheets

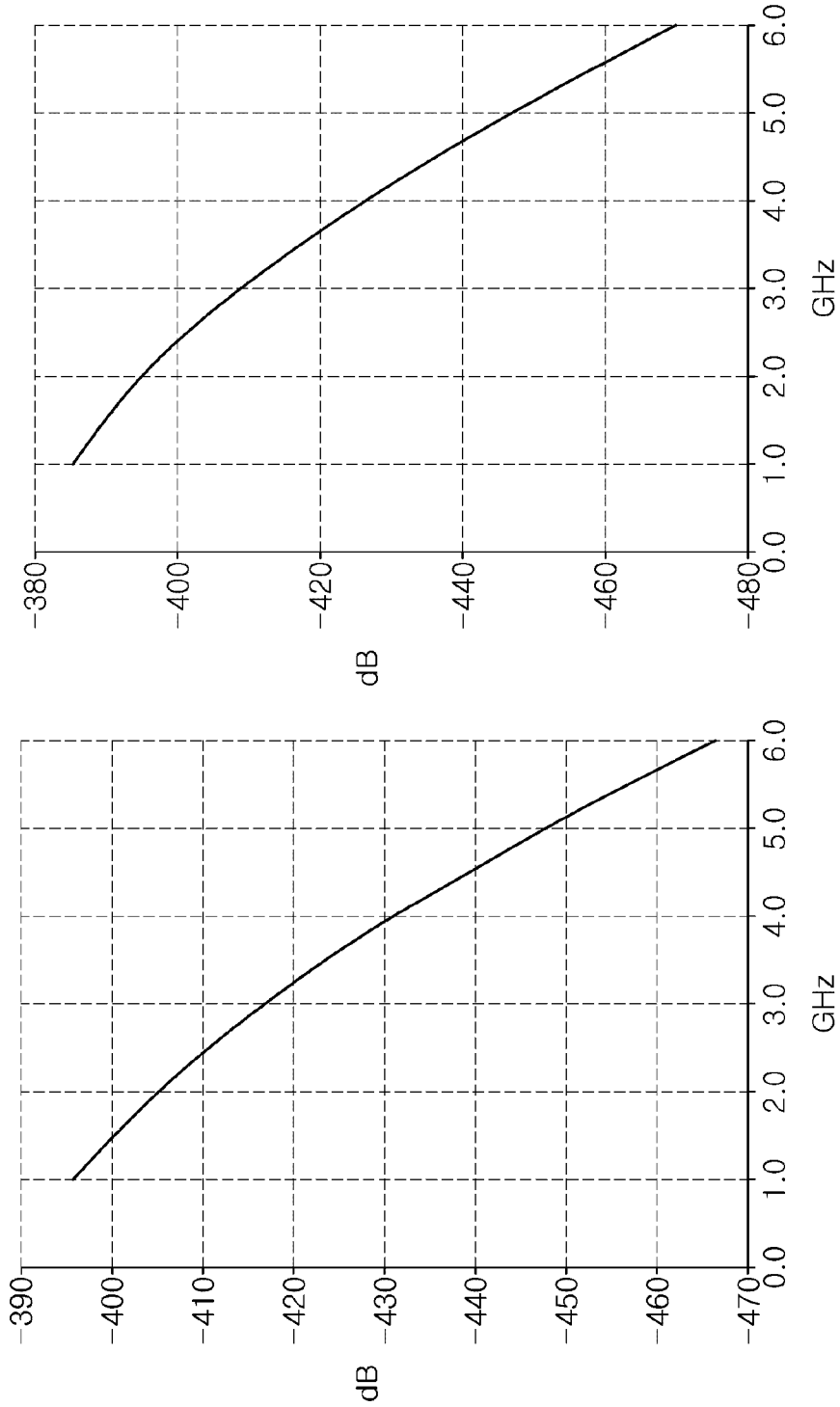

HIGH FREQUENCY SWITCH

CROSS-REFERENCE TO RELATED APPLICATIONS

This application claims the priority of Korean Patent Application No. 10-2012-0133703 filed on Nov. 23, 2012, in the Korean Intellectual Property Office, the disclosure of which is incorporated herein by reference.

BACKGROUND OF THE INVENTION

1. Field of the Invention

The present invention relates to a high frequency switch.

2. Description of the Related Art

In accordance with the development of wireless communications technology, various communications standards have been simultaneously used. In addition, in accordance with the miniaturization of wireless communications modules and the improvement in performance of portable terminals, the application of a plurality of communications standards to a single portable terminal has been demanded. Therefore, the frequency bands that should be supported by a single cellular phone have increased.

In accordance with this trend, support for various frequency bands in a radio frequency (RF) front end field has also been demanded. For example, support for various frequency bands in a high frequency switch positioned on a signal path between an antenna and an RF chipset has been demanded. Therefore, a single pole double throw (SPDT) type switch has been used in various fields. The high frequency switch should significantly decrease insertion loss in order to decrease signal loss and have excellent isolation characteristics in order to significantly decrease interference between various frequency bands.

Recently, as described above, as frequency bands that should be supported in a high frequency switch have increased, research into a technology of variably adjusting high frequency switching characteristics such as insertion loss, isolation, and the like, has been conducted.

The following Related Art Documents (Patent Documents) relate to an SPDT switch. However, these Patent Documents do not disclose variably adjusting high frequency switching characteristics such as insertion loss, isolation, and the like.

RELATED ART DOCUMENT (Patent Document 1) Korean Patent Laid-Open Publication No. 2011-0068584
(Patent Document 2) Korean Patent Laid-Open Publication No. 2006-0094005

SUMMARY OF THE INVENTION

An aspect of the present invention provides a high frequency switch capable of variably adjusting switching characteristics such as insertion loss, isolation, and the like, by individually controlling shunt series switching devices connected between transmitting and receiving ports of the high frequency switch and a ground in order to form a bypass path for a high frequency signal.

According to an aspect of the present invention, there is provided a high frequency switch including: a first signal transferring unit including a plurality of first switching devices connected to each other in series to enable or block signal flow between a common port and a first port according to a first gate signal controlling the plurality of first switching devices; a second signal transferring unit including a plurality of second switching devices connected to each other in series to enable or block signal flow between the common port and a second port according to a second gate signal controlling the plurality of second switching devices; a first shunting unit including a plurality of third switching devices connected to each other in series to enable or block signal flow between the first port and a ground according to a plurality of third gate signals controlling the plurality of third switching devices; and a second shunting unit including a plurality of fourth switching devices connected to each other in series to enable or block signal flow between the second port and the ground according to a plurality of fourth gate signals controlling the plurality of fourth switching devices.

When the signal flow between the first port and the ground is blocked, at least one of the plurality of third switching devices may be turned off, and at least one thereof may be turned on.

When the signal flow between the second port and the ground is blocked, at least one of the plurality of fourth switching devices may be turned off, and at least one thereof may be turned on.

When the signal flow between the first port and the ground is blocked, the at least one third switching device turned on among the plurality of third switching devices may be at least one third switching device connected to the ground and arranged in series with the ground among the plurality of third switching devices.

When the signal flow between the second port and the ground is blocked, the at least one fourth switching device turned on among the plurality of fourth switching devices may be at least one fourth switching device connected to the ground and arranged in series with the ground among the plurality of fourth switching devices.

When the signal flow between the first port and the ground is blocked, in the case in which the second gate signal is a low signal, at least one of the plurality of third gate signals may be a low signal and at least one thereof may be a high signal.

When the signal flow between the second port and the ground is blocked, in the case in which the first gate signal is a low signal, at least one of the plurality of fourth gate signals may be a low signal and at least one thereof may be a high signal.

The high signal, the at least one of the plurality of third gate signals, may be applied to at least one switching device connected to the ground and arranged in series with the ground among the plurality of third switching devices.

The high signal, the at least one of the plurality of fourth gate signals, may be applied to at least one switching device connected to the ground and arranged in series with the ground among the plurality of fourth switching devices.

At least one of the first signal transferring unit, the second signal transferring unit, the first shunting unit, and the second shunting unit may include one of a plurality of field effect transistors (FETs) and a plurality of bipolar junction transistors (BJTs), each of the plurality of FETs has a source and a drain connected to each other in series and a gate to which at least one of the first to fourth gate signals is applied, and each of the plurality of BJTs has an emitter and a collector connected to each other in series and a base to which at least one of the first and fourth gate signals is applied.

The common port may be connected to an antenna.

According to another aspect of the present invention, there is provided a high frequency switch including: a first port inputting and outputting a first high frequency signal; a second port inputting and outputting a second high frequency signal; a common port transmitting or receiving the high frequency signal input or output through the first or second port; a first signal transferring unit including a plurality of first switching devices connected to each other in series to form or block a path for the first high frequency signal between the first port and the common port; a second signal transferring unit including a plurality of second switching devices connected to each other in series to form or block a path for the second high frequency signal between the second port and the common port; a first shunting unit including a plurality of third switching devices connected to each other in series and positioned between the first port and a ground to form or block a first bypass path from the first port to the ground; and a second shunting unit including a plurality of fourth switching devices connected to each other in series and positioned between the second port and the ground to form or block a second bypass path from the second port to the ground.

In the first shunting unit, at least one of the plurality of third switching devices may be turned off and at least one thereof may be turned on when the first bypass path is blocked.

In the second shunting unit, at least one of the plurality of fourth switching devices may be turned off and at least one thereof may be turned on when the second bypass path is blocked.

At least one of the first signal transferring unit, the second signal transferring unit, the first shunting unit, and the second shunting unit may include one of a plurality of FETs and a plurality of BJTs, each of the plurality of FETs has a source and a drain connected to each other in series and a gate to which at least one of the first to fourth gate signals is applied, and each of the plurality of BJTs has an emitter and a collector connected to each other in series and a base to which at least one of the first and fourth gate signals is applied.

The common port may be connected to an antenna.

BRIEF DESCRIPTION OF THE DRAWINGS

The above and other aspects, features and other advantages of the present invention will be more clearly understood from the following detailed description taken in conjunction with the accompanying drawings, in which:

FIGS. 7A through 9B are graphs showing simulation data of the high frequency switch according to the embodiment of the present invention.

DETAILED DESCRIPTION OF THE EMBODIMENTS

Figure 1:
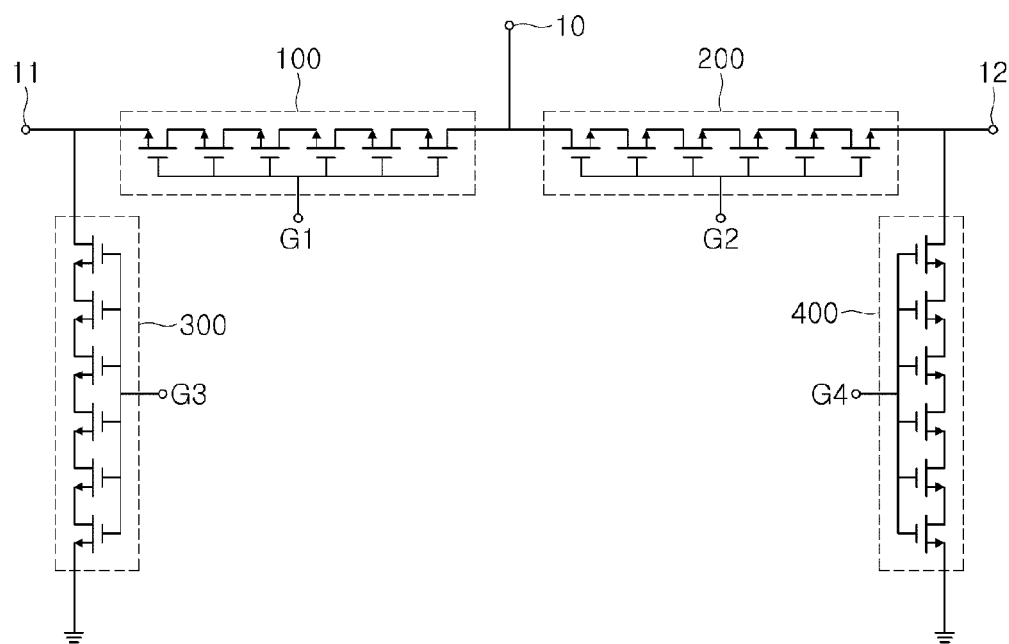
FIG. 1 is a circuit diagram showing an example of a general high frequency switch.

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like elements.

FIG. 1 is a circuit diagram showing an example of a general high frequency switch. The high frequency switch may include a first signal transferring unit 100 including a plurality of first switching devices, a second signal transferring unit 200 including a plurality of second switching devices, a first shunting unit 300 including a plurality of third switching devices, and a second shunting unit 400 including a plurality of fourth switching devices. The plurality of switching devices included in each of the first and second signal transferring units 100 and 200 and the first and second shunting units 300 and 400 may be connected to each other in series and be switched by receiving gate signals G1 to G4 applied from a control terminal, respectively.

Here, each of the first to fourth switching devices may include at least one of a field effect transistor (FET) or a bipolar junction transistor (BJT).

That is, the first and second signal transferring units 100 and 200 and the first and second shunting units 300 and 400 may include at least one of a plurality of FETs and a plurality of BJTs. In this case, each of the plurality of FETs has a source and a drain connected to each other in series and a gate to which one of the gate signals G1 to G4 is applied, and each of the plurality of BJTs has an emitter and a collector connected to each other in series and a base to which one of the gate signals G1 to G4 is applied. In this case, as shown in FIG. 1, the first gate signal G1 may be applied to the first signal transferring unit 100, the second gate signal G2 may be applied to the second signal transferring unit 200, the third gate signal G3 may be applied to the first shunting unit 300, and the fourth gate signal G4 may be applied to the second shunting unit 400.

Hereinafter, the case in which the first signal transferring unit 100 includes one of a plurality of first FETs and a plurality of first BJTs, the second signal transferring unit 200 includes one of a plurality of second FETs and a plurality of second BJTs, the first shunting unit 300 includes one of a plurality of third FETs and a plurality of third BJTs, and the second shunting unit 400 includes one of a plurality of fourth FETs and a plurality of fourth BJTs will be described.

Although the FETs are shown as the plurality of switching devices included in the first and second signal transferring units 100 and 200 and the first and second shunting units 300 and 400 in FIG. 1, the present invention is not limited thereto. That is, the first and second signal transferring units 100 and 200 and the first and second shunting units 300 and 400 may also include the above-mentioned BTJs.

In addition, although the case in which the plurality of FETs are N-channel FETs is shown in FIG. 1, it is obvious to those skilled in the art that the plurality of FETS may include P-channel FETs as well as the N-channel FETs. Further, in the case in which the BJTs are used as the plurality of switching devices, both NPN BJTs and PNP BJTs may be used.

More specifically, although the case in which the number of each of the first and second FETs is 6 is shown in FIG. 1, this is restrictively represented for convenience of explanation and the present invention is not limited thereto. That is, at least two first and second FETs may be provided.

Hereinafter, for convenience of explanation, a description will be provided on the assumption that each of the first and second signal transferring units 100 and 200 and the first and second shut units 300 and 400 includes the N-channel FETs as the plurality of switching devices.

The high frequency switch may be connected to a common port 10 and first and second ports 11 and 12. As shown in FIG. 1, one end of each of the first and second signal transferring units 100 and 200 may be commonly connected to the common port 10, the other end of the first signal transferring unit 100 may be connected to the first port 11, and the other end of the second signal transferring unit 200 may be connected to the second port 12. Here, the common port 10 may be connected to an antenna transmitting or receiving a high frequency signal.

The first signal transferring unit 100 may transfer the high frequency signal that has received in the common port 10 through the antenna to the first port 11 as an input and transfer a high frequency signal output from the first port 11 to the common port 10 as a transmission signal. Hereinafter, the high frequency signal transferred between the first port 11 and the common port 10 will be denoted as a first high frequency signal.

In addition, the second signal transferring unit 200 may transfer the high frequency signal received in the common port 10 through the antenna to the second port 12 as an input and transfer a high frequency signal output from the second port 12 to the common port 10 as a transmission signal. Hereinafter, the high frequency signal transferred between the second port 12 and the common port 10 will be called a second high frequency signal.

Here, the first and second signal transferring units 100 and 200 may transmit or receive the high frequency signal. For example, in the case in which the first signal transferring unit 100 transfers a radio frequency signal to be transmitted, the second signal transferring unit 200 may transfer a radio frequency signal to be received.

The first and second shunting units 300 and 400 may be positioned between the first port 11 and a ground and between the second port 12 and a ground, respectively, to bypass residual signals, or the like, of the first and second signal transferring units 100 and 200 to the ground.

Figure 2:
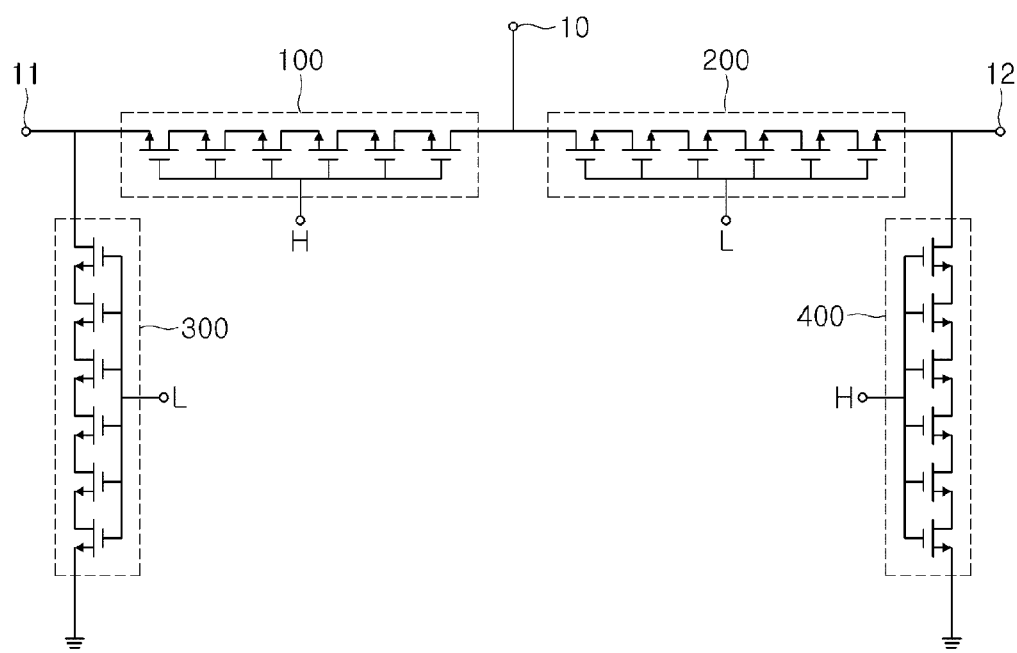
FIG. 2 is a circuit diagram for describing an operation of the high frequency switch of FIG. 1.

FIG. 2 is a circuit diagram for describing an operation of the high frequency switch of FIG. 1. Hereinafter, an operation of the high frequency switch will be described with reference to FIG. 2.

In an example of FIG. 2, the first signal transferring unit 100 may perform a switching operation in the same manner as that of the second shunting unit 400, and the second signal transferring unit 200 may perform a switching operation in the same manner as that of the first shunting unit 300. That is, in this case, the first and fourth gate signals G1 and G4 may be the same signal, and the second and third gate signals G2 and G3 may be the same signal.

A description will be provided with reference to FIGS. 1 and 2 on the assumption that the first and fourth gate signals G1 and G4 applied to the first signal transferring unit 100 and the second shunting unit 400, respectively, are high (H) signals, and the second and third gate signals G2 and G3 applied to the second signal transferring unit 200 and the first shunting unit 300, respectively, are low (L) signals. However, a description of the case in which the first and fourth gate signals G1 and G4 are low (L) signals and the second and third gate signals G2 and G3 are high (H) signals will be omitted with reference to a description to be followed later.

The first signal transferring unit 100 may be in a turned-on state to enable signal flow between the first port 11 and the common port 10, and the second signal transferring unit 200 may be in a turned-off state to block signal flow between the second port 12 and the common port 10. In addition, the first shunting unit 300 may be in a turned-off state to block signal flow between the first port 11 and the ground, and the second shunting unit 400 may be in a turned-on state to enable signal flow between the second port 12 and the ground. In this case, a path from the first port 11 to the common port 10 may be enabled.

Therefore, in this case, the first signal transferring unit 100 may be turned on, such that the first high frequency signal may be smoothly transferred between the first port 11 and the common port 10, and the second signal transferring unit 200 and the first shunting unit 300 may be turned off, such that an unnecessary flow of the first high frequency signal may be blocked. The second shunting unit 400 positioned in a front end of the second port 12 may be turned on to prevent the first high frequency signal from being transferred to the second port 12, whereby isolation characteristics may be improved.

As described above, the first signal transferring unit 100 and the second shunting unit 400 may receive the gate signals G1 and G4 having the same level, respectively, to perform the same switching operation, while the second signal transferring unit 200 and the first shunting unit 300 may receive the gate signals G2 and G3 having the same level, respectively, to perform the same switching operation. However, the present invention is not limited thereto. That is, the first signal transferring unit 100, the second signal transferring unit 200, the first shunting unit 300, and the second shunting unit 400 may also receive the first and fourth gate signals G1 to G4, which are arbitrarily set, to perform different switching operations.

Figure 3:
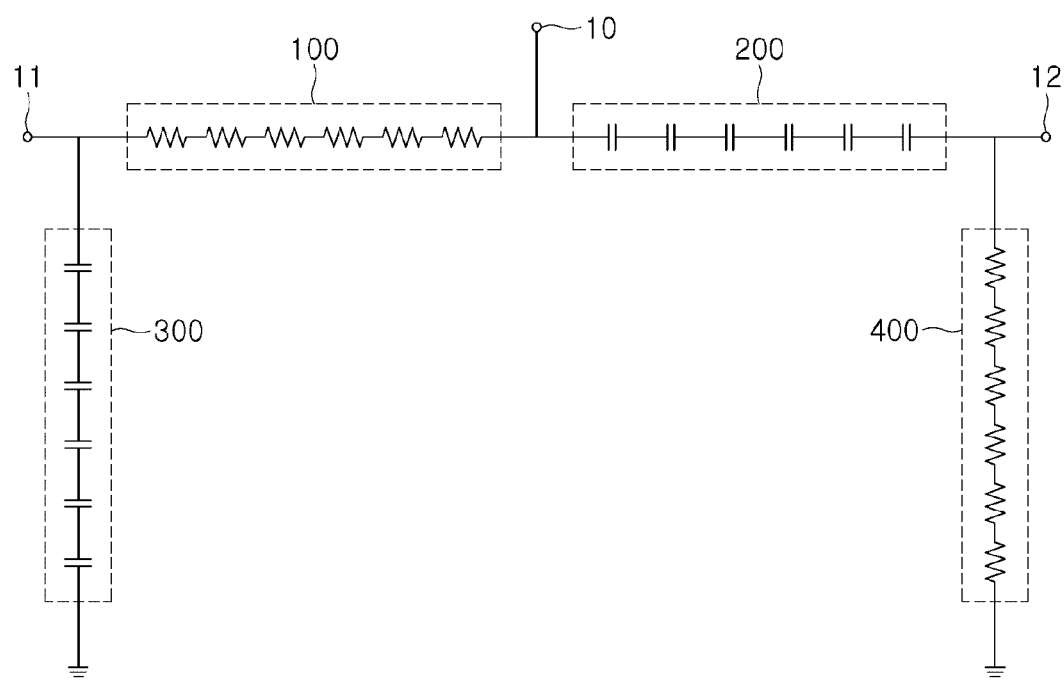
FIG. 3 is an equivalent circuit diagram of the high frequency switch of FIG. 2.

FIG. 3 is an equivalent circuit diagram of the high frequency switch of FIG. 2. Referring to FIG. 3, it may be appreciated that the first signal transferring unit 100 and the second shunting unit 400 to which the high (H) signals are applied are equivalent to a resistance component and the second signal transferring unit 200 and the first shunting unit 300 to which the low (L) signals are applied are equivalent to a capacitance component. Insertion loss and isolation characteristics may be affected by the resistance component and the capacitance component as described above.

Therefore, in order to variably adjust the insertion loss and isolation characteristics of the high frequency switch, the first FETs and the second FETs included in the first shunting unit 300 and the second shunting unit 400, respectively, need to be individually controlled.

Hereinafter, various embodiments of a high frequency switch according to the present invention will be described with reference to FIGS. 4 through 9B. A description of contents the same as or corresponding to the contents described above with reference to FIGS. 1 through 3 will be omitted below. However, those skilled in the art may easily understand various embodiments of the present invention with reference to the above-mentioned contents and the following description.

Figure 4:
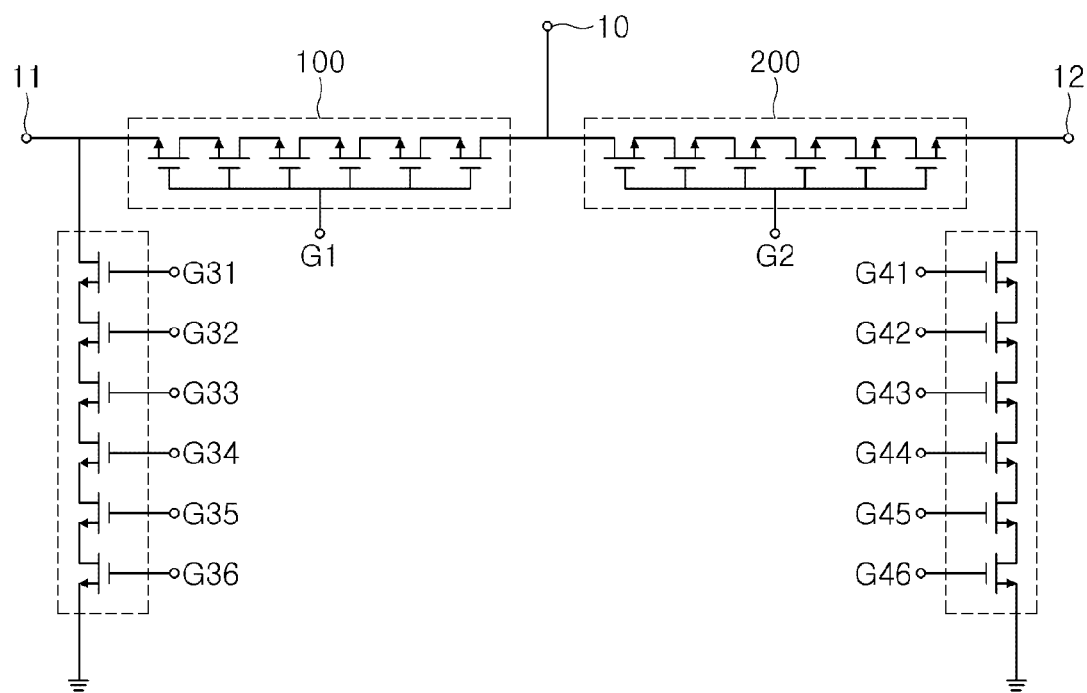
FIG. 4 is a circuit diagram of a high frequency switch according to an embodiment of the present invention.

FIG. 4 is a circuit diagram showing a high frequency switch according to an embodiment of the present invention.

Referring to FIG. 4, the high frequency switch according to the embodiment of the present invention may include the first signal transferring unit 100, the second signal transferring unit 200, the first shunting unit 300, and the second shunting unit 400.

The first signal transferring unit 100 may include a plurality of first switching devices connected to each other in series to thereby enable or block signal flow between the common port 10 and the first port 11 according to the first gate signal G1 controlling the plurality of first switching devices.

The second signal transferring unit 200 may include a plurality of second switching devices connected to each other in series to enable or block signal flow between the common port 10 and the second port 12 according to the second gate signal G2 controlling the plurality of second switching devices.

The first shunting unit 300 may include a plurality of third switching devices connected to each other in series to enable or block signal flow between the first port 11 and the ground according to a plurality of third gate signals G31 to G36 controlling the plurality of third switching devices.

The second shunting unit 400 may include a plurality of fourth switching devices connected to each other in series to enable or block signal flow between the second port 12 and the ground according to a plurality of fourth gate signals G41 to G46 controlling the plurality of fourth switching devices.

As shown in FIG. 4, each of the first to fourth switching devices may include an N-channel field effect transistor. However, the present invention is not limited thereto. That is, the each of the first to fourth switching devices may include a P-channel field effect transistor.

Figure 5:
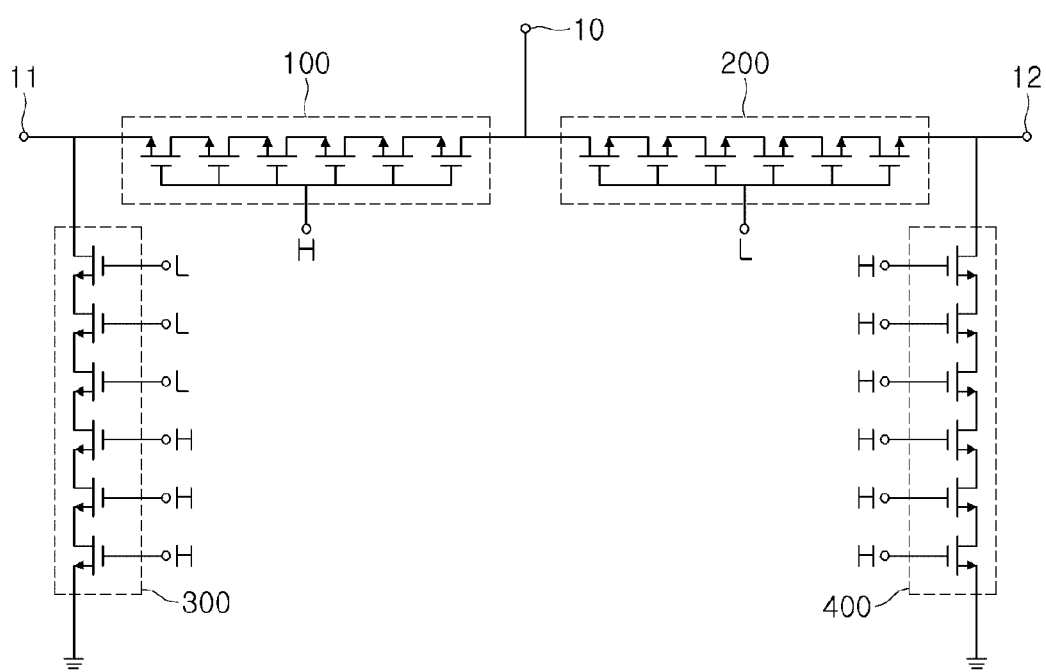
FIG. 5 is a circuit diagram for describing an operation of the high frequency switch according to the embodiment of the present invention.
Figure 6:
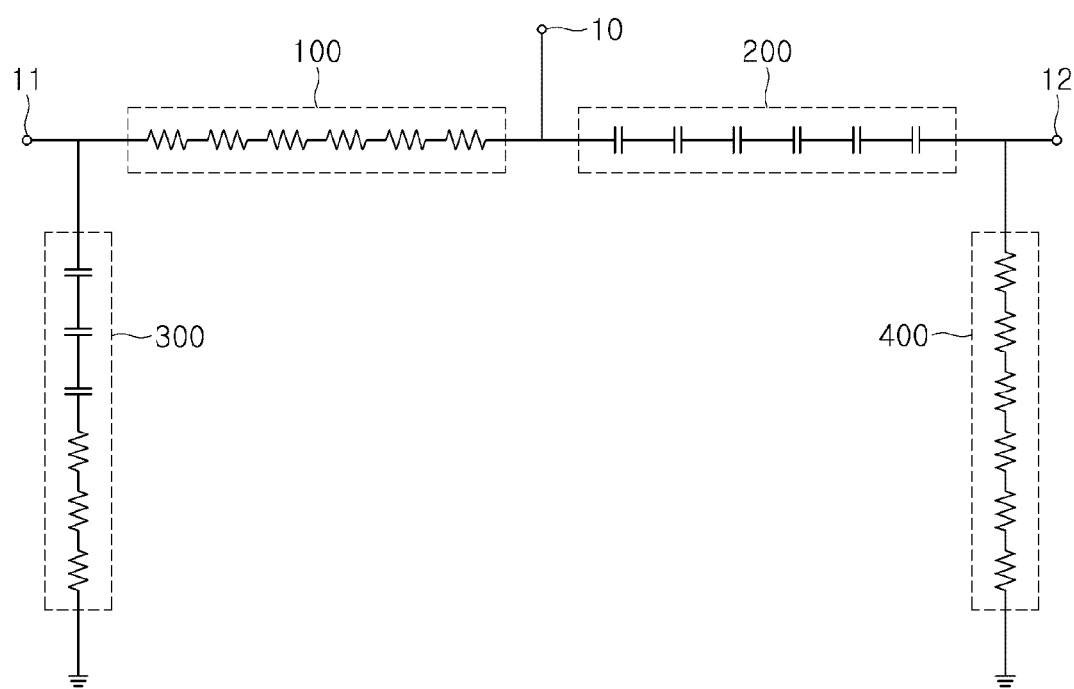
FIG. 6 is an equivalent circuit diagram of the high frequency switch of FIG. 5.

FIG. 5 is a circuit diagram for describing an operation of the high frequency switch according to the embodiment of the present invention; and FIG. 6 is an equivalent circuit diagram of the high frequency switch of FIG. 5.

FIGS. 5 and 6 are views corresponding to FIGS. 2 and 3, respectively. Therefore, a detailed description thereof will be omitted.

As described above, the first shunting unit 300 may include a plurality of third switching devices connected to each other in series to enable or block signal flow between the first port 11 and the ground according to the plurality of third gate signals controlling the plurality of third switching devices.

Unlike the high frequency switch of FIG. 1 according to the related art in which the same gate signal is applied to one shunting unit 100 or 200, in the high frequency switch according to the present invention, the plurality of third gate signals G31 to G36 and the plurality of fourth gate signals G41 to G46 may not be the same single signal in order to variably adjust high frequency characteristics such as isolation, insertion loss, and the like.

For example, in the case in which the first shunting unit 300 blocks respective high frequency signal transfer paths, that is, in the case in which the first shunt part 300 blocks a path between the first port 11 and the ground, at least one of the plurality of third gate signals G31 to G36 applied to the first shunting unit 300 may be a low signal, and at least one thereof may be a high signal. Here, the at least one high signal may be applied to at least one switching device connected to the ground and arranged in series with the ground among the plurality of third switching devices. For example, in the case in which one of the plurality of third gate signals G31 to G36 is a high signal, the third gate signal G36 may be the high signal. Likewise, in the case in which two of the plurality of third gate signals G31 to G36 are high signals, the third gate signals G35 and G36 may be the high signals, and in the case in which three of the plurality of third gate signals G31 to G36 are high signals, the third gate signals G34 to G36 may be the high signals. A description of the case in which four of the plurality of third gate signals G31 to G36 are high signals and the case in which five of the plurality of third gate signals G31 to G36 are high signals will be omitted with reference to the above-mentioned description.

The case in which when the path between the first port 11 and the ground or between the second port 12 and the ground is blocked, lower three of six third gate signals G31 to G36 are high signals and upper three thereof are low signals is shown in FIG. 5. The three gate signals G34 to G36, which are high signals, may be applied to three switching devices connected to the ground and arranged in series with each other.

As another example, in the case in which two gate signals are high signals, the two gate signals may be the gate signals G35 and G36. In this case, in FIG. 6, two lower resistance components adjacent to the ground may be maintained; however, a third lower resistance component from the ground may be changed into a capacitance component.

In FIGS. 4 through 6, since a detailed description of the second shunting unit 400 is the same as that of the first shunting unit 300, it will be omitted. However, the first and second shunting units 300 and 400 according to the present invention are not limited to being operated in the same control scheme. For example, in the case in which a transmitting side and a receiving side are determined, the number of gate signals, which are the high signals, may be changed at the time of blocking high frequency signal paths from each of the first and second ports 11 and 12 to the ground in order to adjust respective optimal high frequency switching characteristics. Therefore, the number of switching devices turned on may also be changed.

FIGS. 7A through 9B are graphs showing simulation data of the high frequency switch according to the embodiment of the present invention.

FIGS. 7A and 7B are graphs showing insertion loss. Referring to FIG. 4, FIG. 7A shows the case in which six third gate signals are low signals and FIG. 7B shows the case in which three upper gate signals of six third gate signals are low signals and three lower gate signals thereof are high signals.

At a frequency of 2.4 GHz, insertion loss is 0.409 dB in the graph of FIG. 7A and is 0.400 dB in the graph of FIG. 7B. As a result, it may be appreciated that the insertion loss is improved.

Figure 8A:
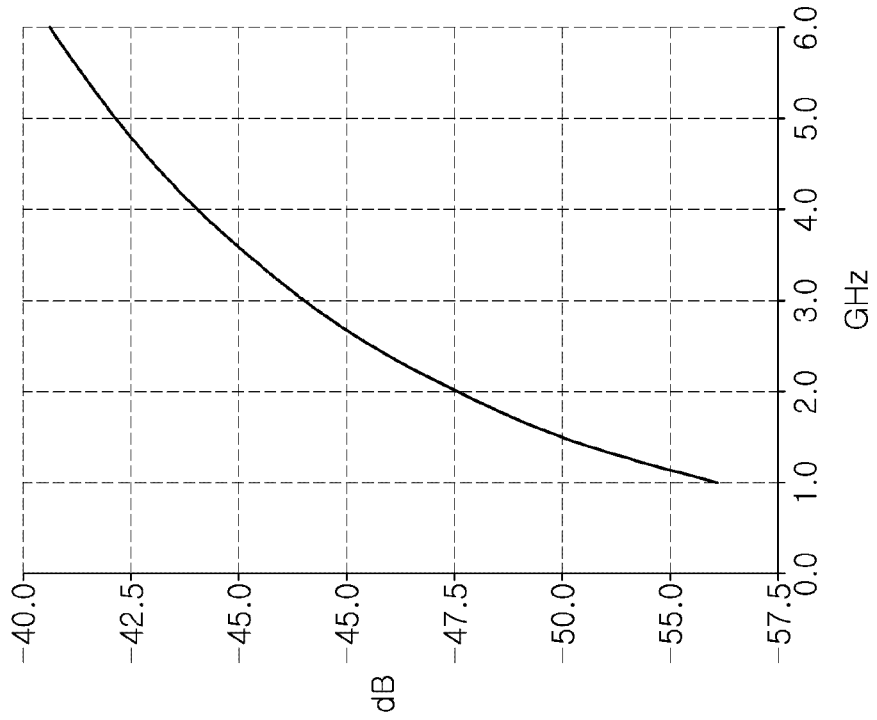
Figure 8B:
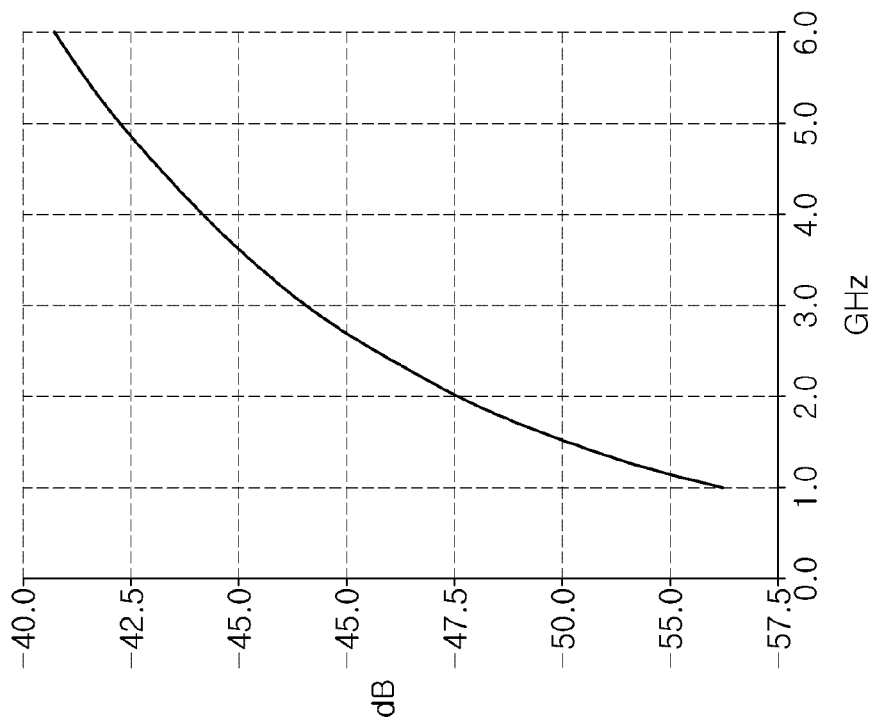

FIGS. 8A and 8B are graphs showing isolation characteristics. Referring to FIG. 4, FIG. 8A shows the case in which six third gate signals are low signals and FIG. 8B shows the case in which upper three gate signals of six third gate signals are low signals and lower three gate signals thereof are high signals.

At a frequency of 2.4 GHz, an isolation characteristic is −48.37 dB in the graph of FIG. 8A and is −48.40 dB in the graph of FIG. 8B. As a result, it may be appreciated that isolation characteristics are improved.

Figure 9A:
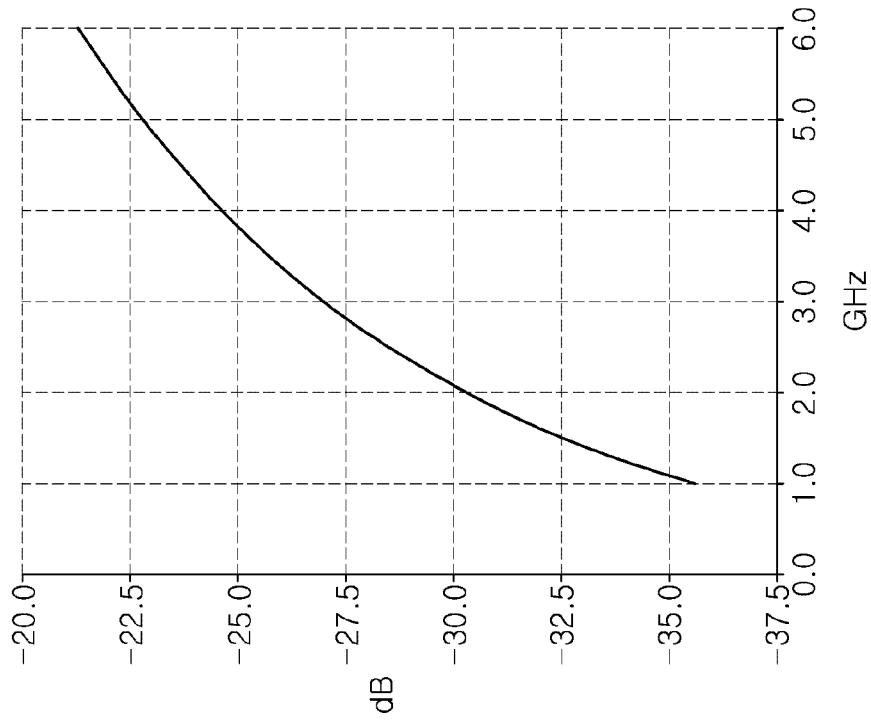
Figure 9B:
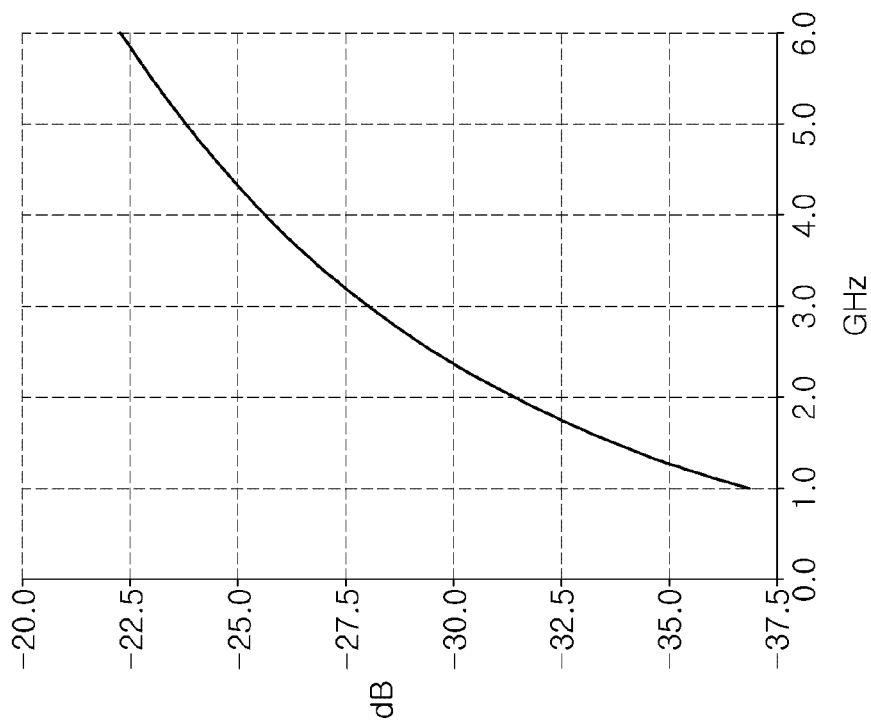

FIGS. 9A and 9B are graphs showing return loss characteristics. Referring to FIG. 4, FIG. 9A shows the case in which six third gate signals are low signals and FIG. 9B shows the case in which upper three gate signals of six third gate signals are low signals and lower three gate signals thereof are high signals.

At a frequency of 2.4 GHz, the high frequency switch of FIG. 1 has return loss characteristics of −28.74 dB and the high frequency switch of FIGS. 4 and 5 has return loss characteristics of −27.25 dB. As a result, it may be appreciated that return loss characteristics are varied.

TABLE 1

|  | Insertion loss (dB) | Isolation (dB) | Return loss (dB) |
| --- | --- | --- | --- |
| Six switches (OFF) | 0.409 | −48.37 | −28.74 |
| Five switches (OFF) + one switch (ON) | 0.406 | −48.38 | −28.46 |
| Four switches (OFF) + two switches (ON) | 0.403 | −48.39 | −28.00 |
| Three switches (OFF) + three switches (ON) | 0.400 | −48.40 | −27.25 |

TABLE 1-continued

|  | Insertion loss (dB) | Isolation (dB) | Return loss (dB) |
|---|---|---|---|
| Two switches (OFF) + four switches (ON) | 0.401 | −48.41 | −25.87 |
| One switch (OFF) + five switches (ON) | 0.417 | −48.44 | −22.63 |

Table 1 shows a data sheet related to characteristics of a high frequency switch in the case in which the plurality of switching devices of the shunting unit are stepwise turned on in sequence adjacent to the ground when the high frequency signal transfer path between the first or second port 12 and the ground is blocked. It may be appreciated from Table 1 that the characteristics of the high frequency switch may be variably adjusted.

As set forth above, according to the embodiments of the present invention, the shunt series switching devices connected between the transmitting and receiving ports of the high frequency switch and the ground in order to form the bypass path for the high frequency signal are individually controlled, whereby the characteristics of the high frequency switch such as the insertion loss, the isolation, and the like, may be easily variably adjusted.

While the present invention has been shown and described in connection with the embodiments, it will be apparent to those skilled in the art that modifications and variations can be made without departing from the spirit and scope of the invention as defined by the appended claims.

What is claimed is:

1. A high frequency switch comprising:
a first signal transferring unit including a plurality of first switching devices connected to each other in series to enable or block signal flow between a common port and a first port according to a first gate signal controlling the plurality of first switching devices;
a second signal transferring unit including a plurality of second switching devices connected to each other in series to enable or block signal flow between the common port and a second port according to a second gate signal controlling the plurality of second switching devices;
a first shunting unit including a plurality of third switching devices connected to each other in series to enable or block signal flow between the first port and a ground according to a plurality of third gate signals controlling the plurality of third switching devices; and
a second shunting unit including a plurality of fourth switching devices connected to each other in series to enable or block signal flow between the second port and the ground according to a plurality of fourth gate signals controlling the plurality of fourth switching devices;
wherein when the first shunting unit blocks signal flow between the first port and the ground, at least one of the plurality of third switching devices is turned on directly connected to the ground and when the second shunting unit blocks signal flow between the second port and the ground, at least one of the plurality of fourth switching devices is turned on connected directly to the ground.

2. The high frequency switch of claim 1, wherein when the signal flow between the first port and the ground is blocked, at least one of the plurality of third switching devices is turned off, and at least one thereof is turned on.

3. The high frequency switch of claim 1, wherein when the signal flow between the second port and the ground is blocked, at least one of the plurality of fourth switching devices is turned off, and at least one thereof is turned on.

4. The high frequency switch of claim 2, wherein when the signal flow between the first port and the ground is blocked, the at least one third switching device turned on among the plurality of third switching devices is at least one third switching device connected to the ground and arranged in series with the ground among the plurality of third switching devices.

5. The high frequency switch of claim 3, wherein when the signal flow between the second port and the ground is blocked, the at least one fourth switching device turned on among the plurality of fourth switching devices is at least one fourth switching device connected to the ground and arranged in series with the ground among the plurality of fourth switching devices.

6. The high frequency switch of claim 1, wherein when the signal flow between the first port and the ground is blocked, in the case in which the second gate signal is a low signal, at least one of the plurality of third gate signals is a low signal and at least one thereof is a high signal.

7. The high frequency switch of claim 1, wherein when the signal flow between the second port and the ground is blocked, in the case in which the first gate signal is a low signal, at least one of the plurality of fourth gate signals is a low signal and at least one thereof is a high signal.

8. The high frequency switch of claim 6, wherein the high signal, the at least one of the plurality of third gate signals, is applied to at least one switching device connected to the ground and arranged in series with the ground among the plurality of third switching devices.

9. The high frequency switch of claim 7, wherein the high signal, the at least one of the plurality of fourth gate signals, is applied to at least one switching device connected to the ground and arranged in series with the ground among the plurality of fourth switching devices.

10. The high frequency switch of claim 1, wherein at least one of the first signal transferring unit, the second signal transferring unit, the first shunting unit, and the second shunting unit includes one of a plurality of field effect transistors (FETs) and a plurality of bipolar junction transistors (BJTs),
each of the plurality of FETs has a source and a drain connected to each other in series and a gate to which at least one of the first to fourth gate signals is applied, and
each of the plurality of BJTs has an emitter and a collector connected to each other in series and a base to which at least one of the first and fourth gate signals is applied.

11. The high frequency switch of claim 1, wherein the common port is connected to an antenna.

12. A high frequency switch comprising:
a first port inputting and outputting a first high frequency signal;
a second port inputting and outputting a second high frequency signal;
a common port transmitting or receiving the high frequency signal input or output through the first or second port;
a first signal transferring unit including a plurality of first switching devices connected to each other in series to form or block a path for the first high frequency signal between the first port and the common port;
a second signal transferring unit including a plurality of second switching devices connected to each other in series to form or block a path for the second high frequency signal between the second port and the common port;
a first shunting unit including a plurality of third switching devices connected to each other in series and positioned between the first port and a ground to form or block a first bypass path from the first port to the ground; and
a second shunting unit including a plurality of fourth switching devices connected to each other in series and positioned between the second port and the ground to form or block a second bypass path from the second port to the ground;
wherein when the first shunting unit blocks the first bypass path, at least one of the plurality of third switching devices is turned on directly connected to the ground and when the second shunting unit blocks the second bypass path, at least one of the plurality of fourth switching devices is turned on directly connected to the ground.

13. The high frequency switch of claim 12, wherein in the first shunting unit, at least one of the plurality of third switching devices is turned off and at least one thereof is turned on when the first bypass path is blocked.

14. The high frequency switch of claim 12, wherein in the second shunting unit, at least one of the plurality of fourth switching devices is turned off and at least one thereof is turned on when the second bypass path is blocked.

15. The high frequency switch of claim 12, wherein at least one of the first signal transferring unit, the second signal transferring unit, the first shunting unit, and the second shunting unit includes one of a plurality of FETs and a plurality of BJTs,
each of the plurality of FETs has a source and a drain connected to each other in series and a gate to which at least one of the first to fourth gate signals is applied, and
each of the plurality of BJTs has an emitter and a collector connected to each other in series and a base to which at least one of the first and fourth gate signals is applied.

16. The high frequency switch of claim 12, wherein the common port is connected to an antenna.

* * * * *